(12) United States Patent
Wang et al.

(10) Patent No.: US 6,387,806 B1
(45) Date of Patent: May 14, 2002

(54) FILLING AN INTERCONNECT OPENING WITH DIFFERENT TYPES OF ALLOYS TO ENHANCE INTERCONNECT RELIABILITY

(75) Inventors: Pin-Chin C. Wang, Menlo Park; Christy M. Woo, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/655,700

(22) Filed: Sep. 6, 2000

(51) Int. Cl.[7] .............................................. H01L 21/44
(52) U.S. Cl. ...................... 438/687; 438/637; 438/660; 438/672; 438/675
(58) Field of Search ................................ 438/694, 643, 438/637, 638, 640, 672, 308, 378, 687, 648, 689, 690, 691, 692, 660, 674, 675, 677

(56) References Cited

U.S. PATENT DOCUMENTS

| | | | | |
|---|---|---|---|---|
| 5,918,149 A | * | 6/1999 | Besser et al. | 438/680 |
| 6,023,100 A | | 2/2000 | Tao et al. | 257/762 |
| 6,066,892 A | * | 5/2000 | Ding et al. | 257/751 |
| 6,100,181 A | * | 8/2000 | You et al. | 438/633 |
| 6,181,012 B1 | * | 1/2001 | Edelstein et al. | 257/762 |
| 6,268,291 B1 | * | 7/2001 | Andricacos et al. | 438/694 |

* cited by examiner

Primary Examiner—Matthew Smith
Assistant Examiner—Victor Yevsikov
(74) Attorney, Agent, or Firm—Monica H. Choi

(57) ABSTRACT

An interconnect opening of an integrated circuit is filled with a conductive fill, such as copper, with the interconnect opening being within an insulating layer on a semiconductor wafer. A seed layer of a first alloy is deposited conformally onto sidewalls and a bottom wall of the interconnect opening. The first alloy is comprised of a first metal dopant in a bulk conductive material. The first metal dopant has a relatively high solid solubility in the bulk conductive material, and the first metal dopant has a concentration in the bulk conductive material of the seed layer that is lower than the solid solubility of the first metal dopant in the bulk conductive material. At least a portion of the conductive fill grown from the seed layer is comprised of a second alloy with a second metal dopant having a relatively low solid solubility in the bulk conductive material, and the second metal dopant has a concentration in the conductive fill that is higher than the solid solubility of the second metal dopant in the bulk conductive material. A thermal anneal is performed to form an additional encapsulating material that covers a top surface of the conductive fill, and the additional encapsulating material is formed from the second metal dopant diffusing out of the conductive fill during the thermal anneal. A layer of bulk passivation material is formed over the additional encapsulating material and the insulating layer. Use of the first alloy of the seed layer prevents agglomeration of the bulk conductive material of the seed layer at the sidewalls of the interconnect opening. The additional encapsulating material prevents drift of material from the conductive fill along the bottom surface of the layer of bulk passivation material and into the surrounding insulating layer.

16 Claims, 8 Drawing Sheets ed circuits. Moreover, reducing the area of an IC die leads to higher yield in IC fabrication. Such advantages are a driving force to constantly scale down IC dimensions.
FILLING AN INTERCONNECT OPENING WITH DIFFERENT TYPES OF ALLOYS TO ENHANCE INTERCONNECT RELIABILITY

TECHNICAL FIELD

The present invention relates generally to fabrication of interconnect, such as copper interconnect for example, within an integrated circuit, and more particularly, to using different types of metal alloys for the seed layer and the conductive fill for filling an interconnect opening to minimize electromigration and void formation within the interconnect.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Thus far, aluminum has been prevalently used for metallization within integrated circuits. However, as the width of metal lines are scaled down to smaller submicron and even nanometer dimensions, aluminum metallization shows electromigration failure. Electromigration failure, which may lead to open and extruded metal lines, is now a commonly recognized problem. Moreover, as dimensions of metal lines further decrease, metal line resistance increases substantially, and this increase in line resistance may adversely affect circuit performance.

Given the concerns of electromigration and line resistance with smaller metal lines and vias, copper is considered a more viable metal for smaller metallization dimensions. Copper has lower bulk resistivity and potentially higher electromigration tolerance than aluminum. Both the lower bulk resistivity and the higher electromigration tolerance improve circuit performance.

Referring to FIG. 1, a cross sectional view is shown of a copper interconnect 102 within a trench 104 formed in an insulating layer 106. The copper interconnect 102 within the insulating layer 106 is formed on a semiconductor wafer 108 such as a silicon substrate as part of an integrated circuit. Because copper is not a volatile metal, copper cannot be easily etched away in a deposition and etching process as typically used for aluminum metallization. Thus, the copper interconnect 102 is typically formed by etching the trench 104 as an opening within the insulating layer 106, and the trench 104 is then filled with copper typically by an electroplating process, as known to one of ordinary skill in the art of integrated circuit fabrication.

Unfortunately, copper is a mid-bandgap impurity in silicon and silicon dioxide. Thus, copper may diffuse easily into these common integrated circuit materials. Referring to FIG. 1, the insulating layer 106 may be comprised of silicon dioxide or a low dielectric constant insulating material such as organic doped silica, as known to one of ordinary skill in the art of integrated circuit fabrication. Copper may easily diffuse into such an insulating layer 106, and this diffusion of copper may degrade the performance of the integrated circuit. Thus, a diffusion barrier material 110 is deposited to surround the copper interconnect 102 within the insulating layer 106 on the sidewalls and the bottom wall of the copper interconnect 102, as known to one of ordinary skill in the art of integrated circuit fabrication. The diffusion barrier material 110 is disposed between the copper interconnect 102 and the insulating layer 106 for preventing diffusion of copper from the copper interconnect 102 to the insulating layer 106 to preserve the integrity of the insulating layer 106.

Further referring to FIG. 1, an encapsulating layer 112 is deposited as a passivation layer to encapsulate the copper interconnect 102, as known to one of ordinary skill in the art of integrated circuit fabrication. The encapsulating layer 112 is typically comprised of a dielectric such as silicon nitride, and copper from the copper interconnect 102 does not easily diffuse into such a dielectric of the encapsulating layer 112.

Referring to FIG. 1, in the prior art, the encapsulating layer 112 of silicon nitride is deposited directly onto an exposed surface of the copper interconnect 102 and the surrounding insulating layer 106 after the exposed surface of the copper interconnect 102 and the surrounding insulating layer 106 are polished to a level surface. Unfortunately, the silicon nitride of the encapsulating layer 112 does not bond well to the copper at the exposed surface of the copper interconnect 102.

Thus, although copper does not diffuse easily through the encapsulating layer 112 of silicon nitride, copper from the copper interconnect 102 laterally drifts from the interface between the copper interconnect 102 and the encapsulating layer 112 of silicon nitride along the bottom surface 114 of the encapsulating layer 112 of silicon nitride because of the weak bonding of the copper interconnect 102 and the encapsulating layer 112 of silicon nitride.

The copper that laterally drifts from the interface between the copper interconnect 102 and the encapsulating layer 112 of silicon nitride along the bottom surface 114 of the encapsulating layer 112 eventually diffuses into the insulating layer 106 to disadvantageously degrade the insulating property of the insulating layer 106 and to possibly degrade the copper interconnect electromigration life-time. Nevertheless, use of copper metallization is desirable for further scaling down integrated circuit dimensions because of the lower bulk resistivity and the higher electromigration tolerance. Thus, a mechanism is desired for preventing the drift of copper from the copper interconnect 102 into the insulating layer 106.

In addition, typically for filling the trench 104 with copper, a seed layer of copper is deposited on the sidewalls and the bottom wall of the trench, and then copper is electroplated from the seed layer to fill the trench 104 in an ECD (electro chemical deposition) process, as known to one of ordinary skill in the art of integrated circuit fabrication. The seed layer of copper is typically deposited by a conformal deposition process such as a PVD (plasma vapor deposition) process or a CVD (chemical vapor deposition) process as known to one of ordinary skill in the art of integrated circuit fabrication. With such conformal deposition processes, referring to FIG. 2, when the aspect ratio (defined as the depth to the width) of an interconnect opening 120 to be filled with copper is relatively large (i.e., greater than 5:1), a seed layer 122 that is deposited on the sidewalls and the bottom wall of the opening 120 may have a significant overhang 124 at the top corners of the interconnect opening 120.

Referring to FIGS. 2 and 3, when copper fill 126 is plated from the seed layer 122, the copper that is plated from the overhang 124 may close off the top of the interconnect opening 120 before a center portion of the interconnect opening 120 is filled with copper to result in formation of a void 128 within the copper fill 126 toward the center of the interconnect opening 120. Such a void 128 disadvantageously increases the resistance of the interconnect and may even contribute to electromigration failure of the interconnect.

Referring to FIG. 4, to minimize the overhang 124 at the top corners of the interconnect opening 120, the seed layer of copper 122 is deposited to be thinner. However, the deposition of the seed layer 122 is not perfectly conformal with the seed layer 122 being even thinner at the sidewalls of the interconnect opening 120. With such a thinner seed layer 122, the thickness of the seed layer 122 may be as small as tens of angstroms at the sidewalls of the interconnect opening 120, and granules 130 of agglomerated copper may form at the sidewalls of the interconnect opening 120. Such granules 130 result in a discontinuous seed layer of copper 122, and when copper is electroplated from such a discontinuous seed layer of copper 122, voids are more likely to form within the copper filling the interconnect opening 120.

Nevertheless, a relatively thin seed layer 122 of copper is desired for minimizing overhang at the top corners of the interconnect opening having high aspect ratio with submicron and even nanometer dimensions. Thus, a mechanism is desired for minimizing formation of granules 130 of agglomerated copper at the sidewalls of the interconnect opening 120 when the seed layer 122 is relatively thin.

SUMMARY OF THE INVENTION

Accordingly, in a general aspect of the present invention, a first type of copper alloy is used for formation of the seed layer of copper to minimize formation of the granules of agglomerated copper at the sidewalls of the interconnect opening. In addition, a second type of copper alloy is used to fill the interconnect opening to form an additional encapsulating material at the top surface of the conductive fill of the interconnect opening to prevent drift of copper from the copper interconnect into the surrounding insulating layer.

In one aspect of the present invention, an interconnect opening of an integrated circuit is filled with a conductive fill with the interconnect opening being within an insulating layer on a semiconductor wafer. A seed layer of a first alloy is deposited conformally onto sidewalls and a bottom wall of the interconnect opening. The first alloy is comprised of a first metal dopant in a bulk conductive material. The first metal dopant has a solid solubility in the bulk conductive material that is higher than about 0.09 atomic percent at about room temperature, and the first metal dopant has a concentration in the bulk conductive material of the seed layer that is lower than the solid solubility of the first metal dopant in the bulk conductive material.

The interconnect opening is filled with the bulk conductive material by growing the bulk conductive material from the seed layer to form a conductive fill within the interconnect opening. At least a portion of the conductive fill is comprised of a second alloy with a second metal dopant having a solid solubility in the bulk conductive material that is less than about 0.1 atomic percent at about room temperature, and the second metal dopant has a concentration in the conductive fill that is higher than the solid solubility of the second metal dopant in the bulk conductive material.

Any of the seed layer of the first alloy and the bulk conductive material are polished away from the insulating layer surrounding the interconnect opening such that the conductive fill is contained within the interconnect opening. A thermal anneal is performed to form an additional encapsulating material that covers a top surface of the conductive fill, and the additional encapsulating material is formed from the second metal dopant diffusing out of the conductive fill during the thermal anneal. A layer of bulk passivation material is formed over the additional encapsulating material and the insulating layer.

Use of the first alloy of the seed layer prevents agglomeration of the bulk conductive material of the seed layer at the sidewalls of the interconnect opening. In addition, because the first metal dopant has a relatively high solid solubility, the first metal dopant remains within the seed layer during the thermal anneal. On the other hand, because the second metal dopant has a relatively low solid solubility within the second alloy of the conductive fill, the second metal dopant diffuses out to the top surface of the conductive fill during the thermal anneal to form the additional encapsulating material for preventing drift of material from the conductive fill along the bottom surface of the layer of bulk passivation material and into the surrounding insulating layer.

The present invention may be used to particular advantage when the bulk conductive material is copper, and when the first metal dopant of the first alloy of the copper seed layer is one of silver and zinc. When the bulk conductive material is copper, the second metal dopant of the second alloy of the conductive fill may be one of tantalum, calcium, and cerium. In that case, the additional encapsulating material may be the second metal dopant. Alternatively, when the second metal dopant of the second alloy of the conductive fill is zirconium, the additional encapsulating material may be an intermetallic compound formed from a reaction of the second metal dopant with copper of the conductive fill during the thermal anneal. When the top surface of the conductive fill is exposed to oxygen plasma during the thermal anneal, the additional encapsulating material may be metal oxide formed from a reaction of the oxygen plasma with the second metal dopant during the thermal anneal.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, 18, and 19 refer to elements having similar structure and function.

DETAILED DESCRIPTION

The present invention is described for formation of copper interconnect. However, the present invention may be practiced for preventing drift of material from other types of interconnects into the surrounding insulating layer, as would be apparent to one of ordinary skill in the art of integrated circuit fabrication from the description herein.

Figure 5:
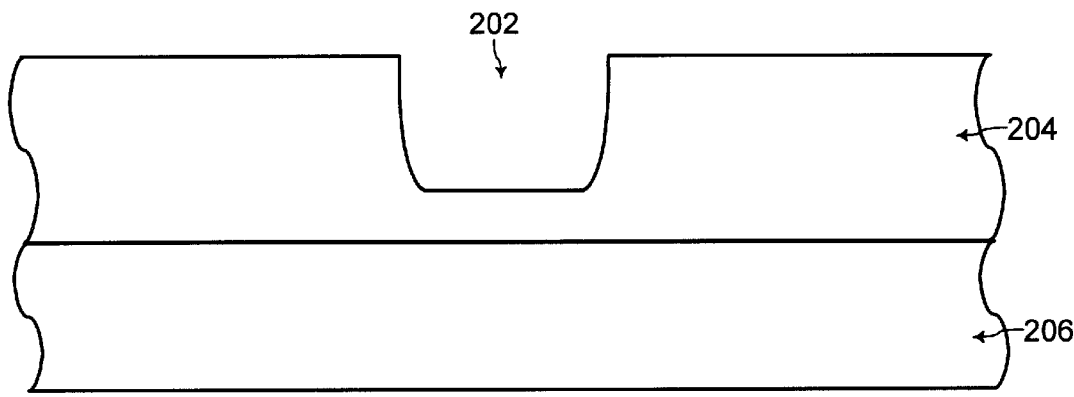
FIGS. 5, 6, 7, 8, 9, 10, 11, 12, 13, 14 15, 16, 17, 18, and 19 show cross-sectional views for formation of an interconnect to illustrate process steps for forming a conductive fill within an interconnect opening that is formed in an insulating layer by using a first type of copper alloy for the seed layer of copper to minimize formation of granules of agglomerated copper at the sidewalls of the interconnect opening. In addition, these figures illustrate process steps for using a second type of copper alloy to fill the interconnect opening to form an additional encapsulating material at the top surface of the conductive fill of the interconnect opening to prevent drift of copper from the copper interconnect into the surrounding insulating layer.

Referring to FIG. 5, for forming an interconnect such as copper interconnect, an interconnect opening 202 such as a trench line is formed within an insulating layer 204 on a semiconductor wafer 206 as part of an integrated circuit, as known to one of ordinary skill in the art of integrated circuit fabrication. Typically, the semiconductor wafer 206 is comprised of silicon (Si), and the insulating layer 204 is comprised of silicon dioxide ($SiO_2$) or a low dielectric constant insulating material such as organic doped silica, as known to one of ordinary skill in the art of integrated circuit fabrication.

Copper interconnect is desirable for metallization within an integrated circuit with scaled down dimensions because copper has lower bulk resistivity and potentially higher electromigration tolerance than aluminum. However, because copper is not a volatile metal, copper cannot be easily etched away in a deposition and etching process as typically used for aluminum metallization. Thus, copper interconnect is typically formed by etching the interconnect opening 202 within the insulating layer 204 and then filling the interconnect opening 202 with copper fill.

Figure 6:
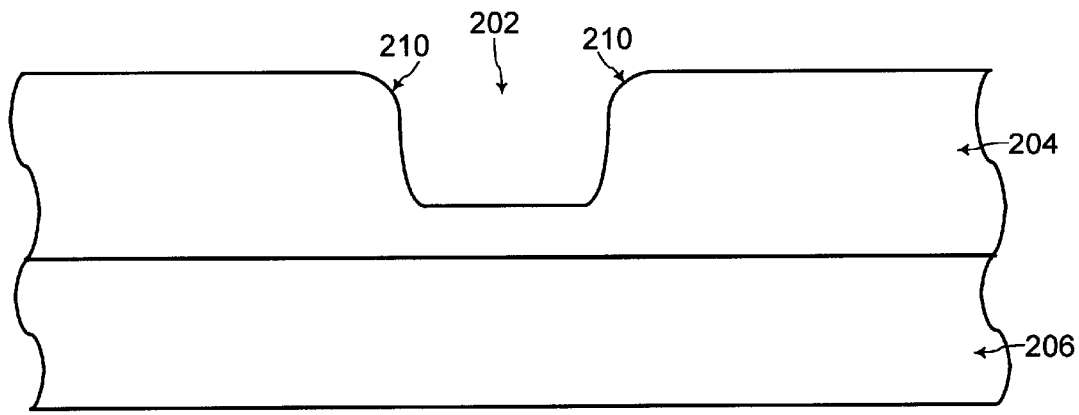

Referring to FIG. 6, the top corners 210 of the interconnect opening 202 are rounded by a sputtering process. Sputtering processes are known to one of ordinary skill in the art of integrated circuit fabrication.

Figure 7:
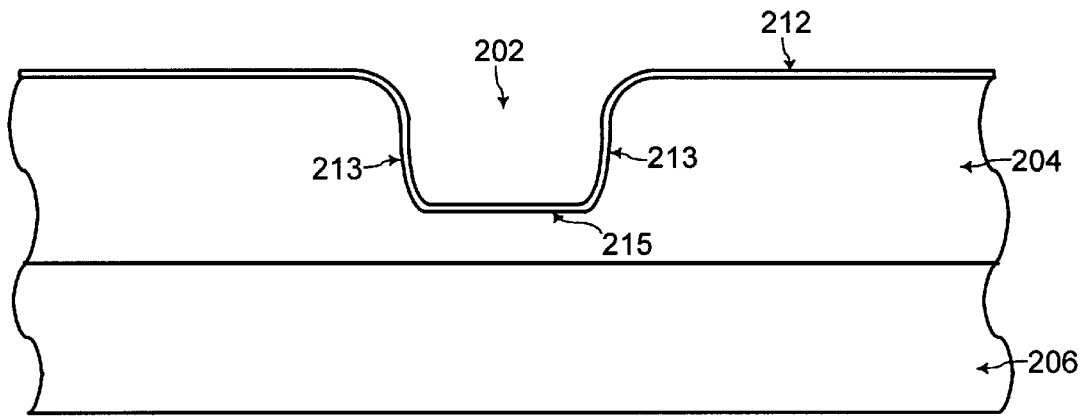

Referring to FIG. 7, a diffusion barrier layer 212 is deposited on the exposed surfaces of the insulating layer 204 including the sidewalls 213 and the bottom wall 215 of the interconnect opening 202. The diffusion barrier layer 212 is comprised of a diffusion barrier material that prevents diffusion of copper to be filled within the interconnect opening 202 into the surrounding insulating layer 204. Such diffusion barrier materials and processes for deposition of such diffusion barrier materials are known to one of ordinary skill in the art of integrated circuit fabrication.

Figure 1:
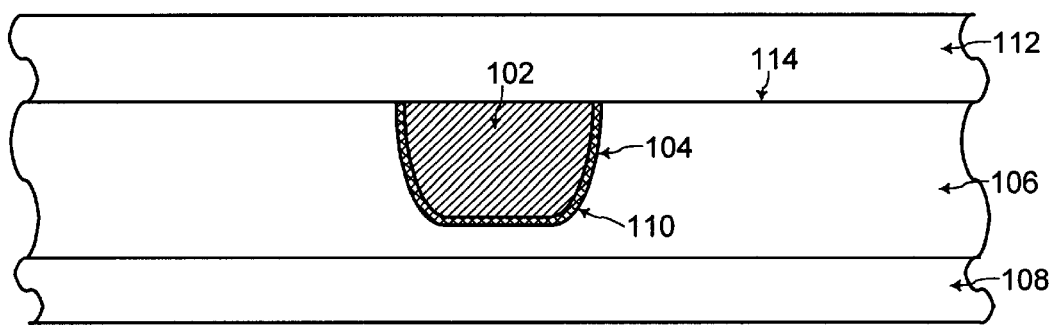
FIG. 1 shows a cross-sectional view of a copper interconnect formed by copper filling a trench within an insulating layer, according to the prior art.
Figure 2:
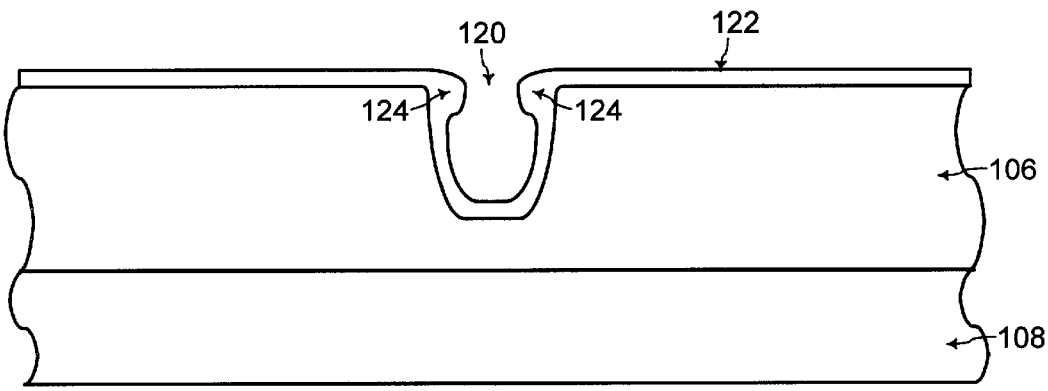
FIG. 2 shows a cross-sectional view of a seed layer of copper deposited on the sidewalls and bottom wall of an interconnect opening for illustrating the formation of an overhang of the seed layer at the top corners of the interconnect opening when a relatively thick seed layer is deposited, according to the prior art.
Figure 3:
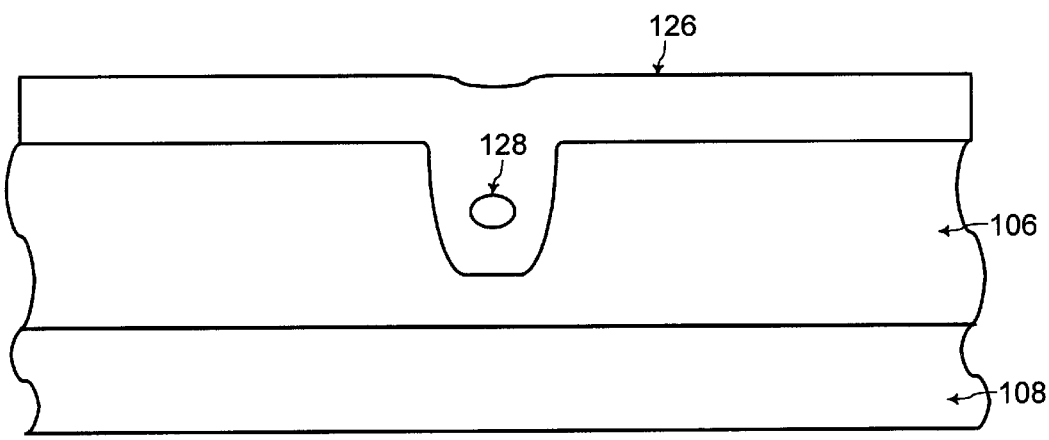
FIG. 3 shows a cross-sectional view of a copper fill plated from the seed layer of FIG. 2 for illustrating the formation of a void within the copper fill from the overhang of the seed layer of FIG. 2, according to the prior art.
Figure 4:
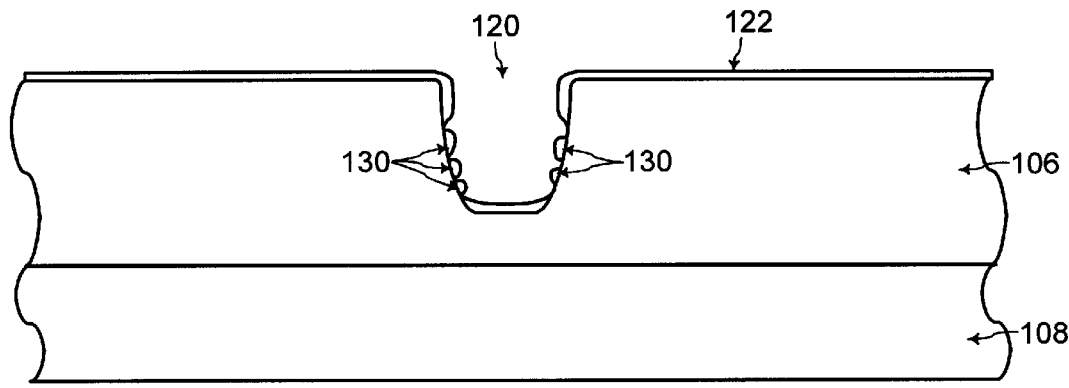
FIG. 4 shows a cross-sectional view of a relatively thin seed layer of copper deposited on the sidewalls and bottom wall of an interconnect opening for illustrating the formation of granules of agglomerated copper at the sidewalls of the interconnect opening, according to the prior art.

Unfortunately, copper is a mid-bandgap impurity in silicon and silicon dioxide. Thus, copper may diffuse easily into these common integrated circuit materials. Referring to FIG. 2, the insulating layer 204 is typically comprised of silicon dioxide or a low dielectric constant insulating material such as organic doped silica, as known to one of ordinary skill in the art of integrated circuit fabrication, especially when the semiconductor wafer 206 is a silicon substrate.

Copper may easily diffuse into the insulating layer 204, and this diffusion of copper may degrade the performance of the integrated circuit. Thus, the diffusion barrier layer 212 is deposited to surround the copper to be filled within the interconnect opening 202. The diffusion barrier layer 212 prevents diffusion of copper to filled within the interconnect opening 202 to the insulating layer 204 to preserve the integrity of the insulating layer 204.

Figure 8:
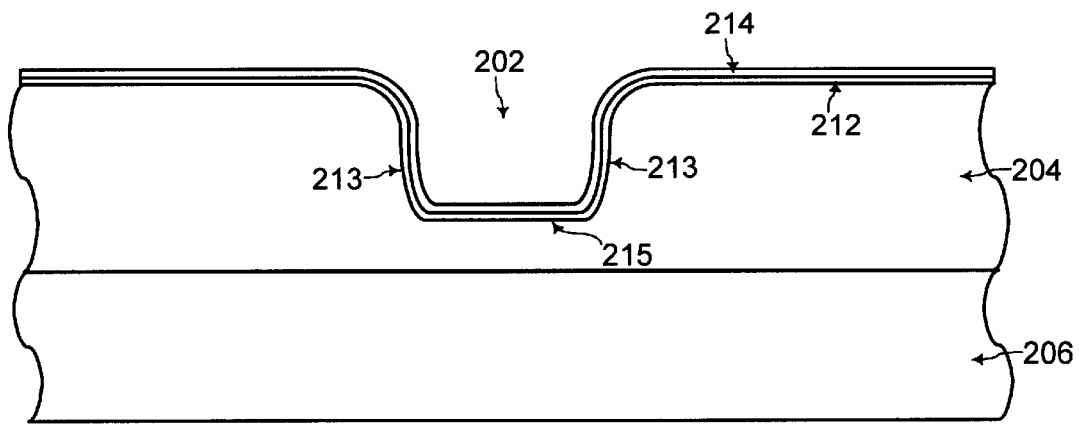

Referring to FIG. 8, a copper seed layer 214 of a first alloy is conformally deposited on the diffusion barrier layer 212. The first alloy of the copper seed layer 214 is comprised of a first metal dopant that has a relatively high solid solubility (greater than about 0.09 atomic percent at about room temperature) within copper as the bulk conductive material. Examples of such a first metal dopant include silver and zinc. For example, silver has a solid solubility in copper of about 0.1 atomic percent at about room temperature, and zinc has a solid solubility in copper of about 33 atomic percent at about room temperature.

In addition, the first metal dopant has a concentration in copper of the seed layer 214 that is less than the solid solubility of the first metal dopant in copper. For example, when the first metal dopant is silver, the concentration of silver in copper of the seed layer 214 may be in a range of from about 0.01 atomic percent to about 0.09 atomic percent. When the first metal dopant is zinc, the concentration of zinc in copper of the seed layer 214 may be in a range of from about 0.01 atomic percent to about 5.0 atomic percent.

With use of such a copper alloy for the seed layer 214, the thickness of the seed layer 214 may be relatively thin in a range of from about 20 Å (angstroms) to about 50 Å (angstroms) without formation of granules of agglomerated copper at the sidewalls 213 of the interconnect opening 202. In contrast, the thickness of a seed layer of pure copper may have a lower limit of about 80 Å (angstroms) before the seed layer agglomerates at the sidewalls 213 of the interconnect opening 202. In addition, the thickness of a seed layer of pure copper which is more dependent on thermal processes and the type of diffusion barrier layer 212 is harder to control.

The first metal dopant within the copper of the seed layer 214 promotes uniform deposition for a thin continuous seed layer 214 without formation of granules of agglomerated copper at the sidewalls 213 of the interconnect opening 202. Processes for conformal deposition of such an alloy for the seed layer 214, such as CVD (chemical vapor deposition), IMP (ionized metal plasma) deposition, and continuous PVD (physical vapor deposition), are known to one of ordinary skill in the art of integrated circuit fabrication.

Figure 9:
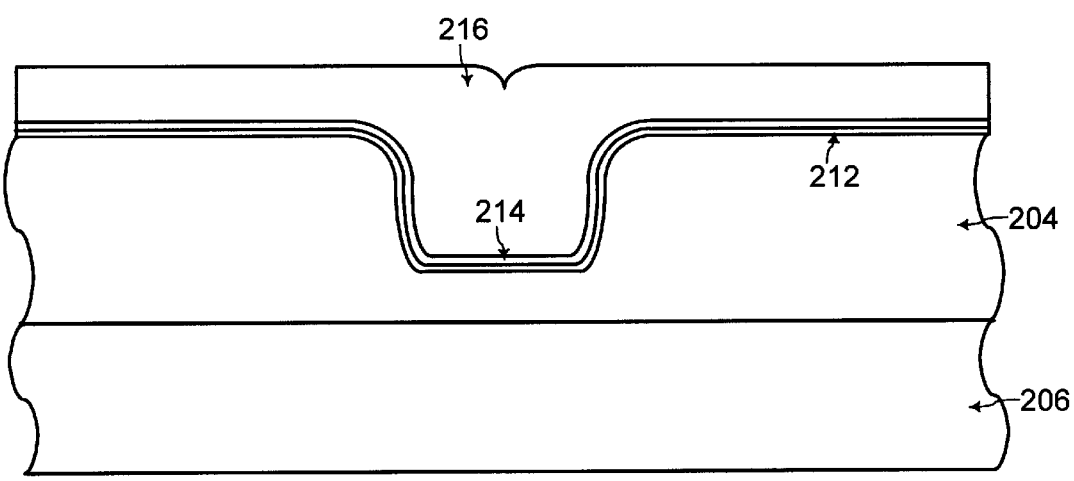

Referring to FIG. 9, the interconnect opening 202 is filled with the bulk conductive material 216 of the seed layer 214 by electroplating from the seed layer 214. Electroplating processes for filling the interconnect opening 202 with the conductive material 216 are known to one of ordinary skill in the art of integrated circuit fabrication.

In one embodiment of the present invention, the whole portion of the conductive material 216 electroplated from the seed layer 214 is comprised of a second alloy with a second metal dopant that has a relatively low solid solubility (less than about 0.1 atomic percent at about room temperature) within copper as the bulk conductive material. Examples of such a second metal dopant include tantalum, calcium, cerium, and zirconium. In addition, the second metal dopant has a concentration in the bulk conductive material 216 that is greater than the solid solubility of the second metal dopant in the bulk conductive material 216. For example, when the second metal dopant is comprised of one tantalum, calcium, cerium, and zirconium, the concentration of the second metal dopant in the bulk conductive material 216 comprised of copper may be in a range of from about 0.01 atomic percent to about 1 atomic percent because the solid solubility of such metal dopants is negligible in copper.

Figure 10:
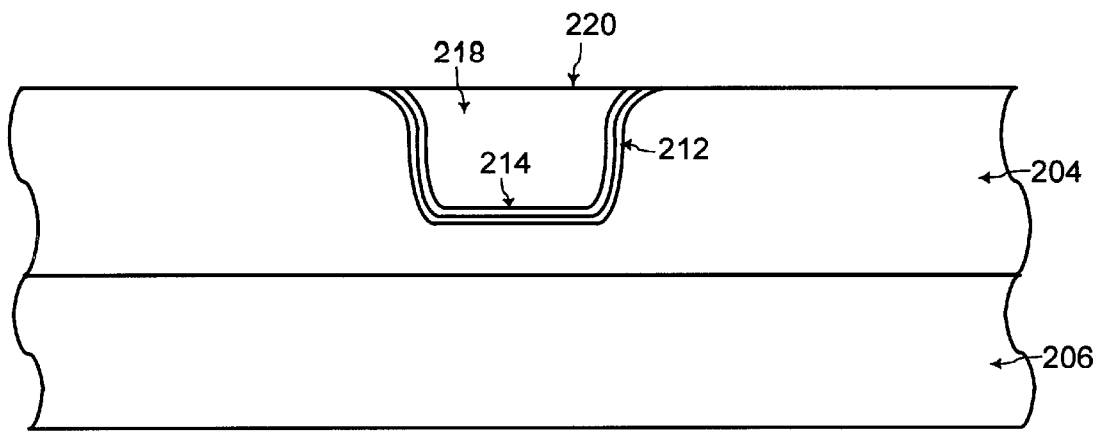

Referring to FIG. 10, any bulk conductive material 216 is polished away from the insulating layer 204 typically using a CMP (Chemical Mechanical Polishing) process such that the bulk conductive material 216 is contained within the interconnect opening 202 to form a conductive fill 218 within the interconnect opening 202. In addition, the seed layer 214 and the diffusion barrier layer 212 are also typically polished away from the insulating layer 204 during this CMP process to expose the insulating layer 204. CMP (Chemical Mechanical Polishing) processes are known to one of ordinary skill in the art of integrated circuit fabrication.

Typically, a pre-CMP anneal is performed to ensure consistency of density of copper of the bulk conductive material 216 across the semiconductor wafer 206 before such a polishing process, as known to one of ordinary skill in the art of integrated circuit fabrication. The pre-CMP anneal is typically performed at a temperature in a range of from about 100° Celsius to about 300° Celsius for a time period of from about 30 second to about 60 minutes, as known to one of ordinary skill in the art of integrated circuit fabrication. A shorter anneal time is used for a higher anneal temperature. For example, when the anneal temperature is about 100° Celsius, the anneal time is about 60 minutes, and when the anneal temperature is about 300° Celsius, the anneal time is about 30 seconds. In addition, the anneal temperature and the anneal time depend on the dimensions of the interconnect with a lower anneal temperature and a longer anneal time being used for smaller dimensions of the interconnect.

Such a pre-CMP anneal results in consistency of density of copper of the bulk conductive material 216 across the semiconductor wafer 206 before the polishing process. The metal dopants within the seed layer 214 and the bulk conductive material 216 remain within the seed layer 214 and the bulk conductive material 216 during this pre-CMP anneal process. Such pre-CMP anneal processes are known to one of ordinary skill in the art of integrated circuit fabrication.

Figure 11:
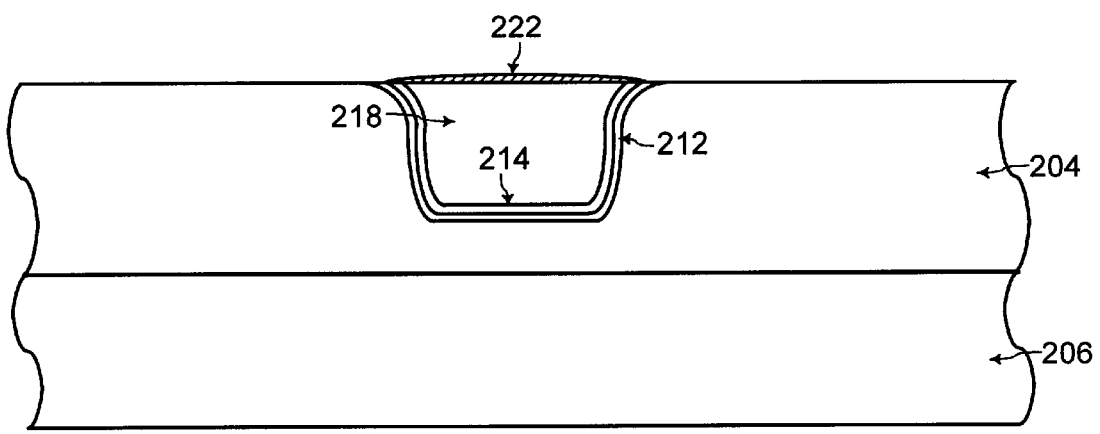

Referring to FIGS. 10 and 11, with the top surface 220 of the conductive fill 218 exposed, a thermal anneal is performed by heating up the semiconductor wafer 206 to a temperature in a range of from about 250° Celsius to about 400° Celsius for a time period in a range of from about 1 minute to about 60 minutes. A shorter anneal time is used for a higher anneal temperature. For example, when the anneal temperature is about 250° Celsius, the anneal time is about 60 minutes, and when the anneal temperature is about 400° Celsius, the anneal time is about 1 minute. Thermal anneal processes are known to one of ordinary skill in the art of integrated circuit fabrication.

During this thermal anneal process, the copper of the conductive fill 218 recrystallizes into a single grain structure of substantially pure copper as the second metal dopant of the conductive fill 218 diffuses out from the conductive fill 218 to the top surface 220 of the conductive fill 218. The single grain structure of substantially pure copper of the conductive fill 218 minimizes resistance of the interconnect such that the speed performance of the integrated circuit having the interconnect of the present invention is enhanced.

Because the metal dopant has a concentration within the conductive fill 218 that is larger than the solid solubility of the metal dopant in the bulk conductive material of the conductive fill 218, the metal dopant segregates out of the conductive fill 218 during the thermal anneal. The metal dopant of the conductive fill 218 that segregates out of the conductive fill 218 to the top surface 220 of the conductive fill 218 forms an additional encapsulating material 222 that covers the top surface of the conductive fill 218.

For example, when the metal dopant of the conductive fill 218 is comprised of one of tantalum, calcium, or cerium, the additional encapsulating material 222 that covers the top surface of the conductive fill 218 is the metal dopant that accumulates at the top surface 220 of the conductive fill 218. In that case, the additional encapsulating material may also form at the interface between the seed layer 214 and the conductive fill 218.

Figure 12:
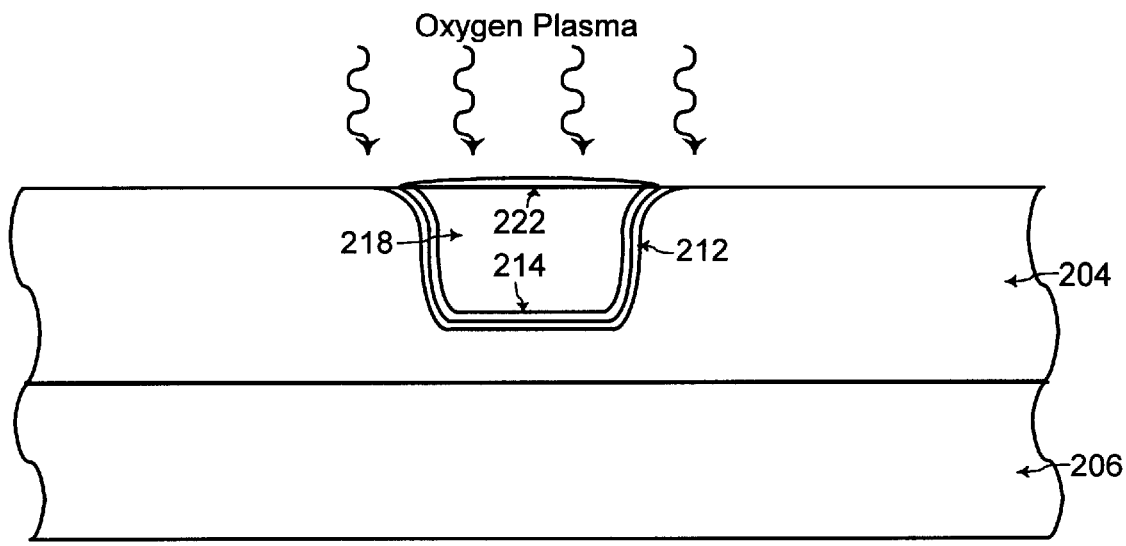

Alternatively, when the metal dopant of the conductive fill 218 is comprised of zirconium for example, the additional encapsulating material 222 that covers the top surface of the conductive fill 218 is an intermetallic compound formed from a reaction of the metal dopant with the copper at the top surface of the conductive fill 218. Referring to FIG. 12, in an alternative embodiment of the present invention, the top surface of the conductive fill 218 is exposed to oxygen plasma during the thermal anneal. In that case, when the metal dopant of the conductive fill 218 is comprised of zirconium for example, the additional encapsulating material 222 that covers the top surface of the conductive fill 218 is a metal oxide formed from a reaction of the metal dopant with the oxygen plasma at the top surface of the conductive fill 218. Processes for formation of oxygen plasma are known to one of ordinary skill in the art of integrated circuit fabrication.

Figure 13:
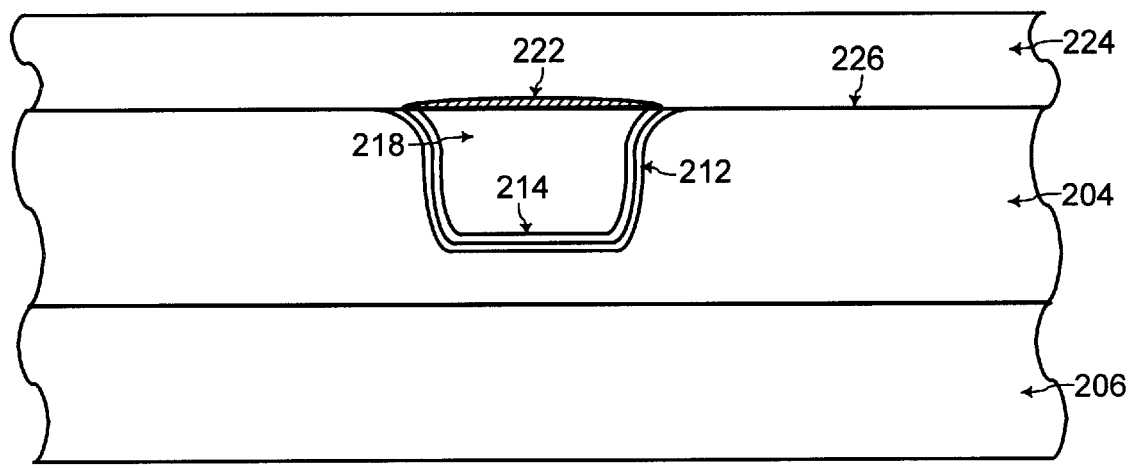

Referring to FIG. 13, for any type of the additional encapsulating material 222, a layer of bulk passivation material 224 is deposited on the additional encapsulating material 222 and the insulating layer 204. The bulk passivation material 224 may be comprised of one of silicon oxynitride (SiON), silicon nitride (SiN), and a silicon carbide (SiC) film doped with hydrogen, and copper does not easily diffuse through such a bulk passivation material 224. Processes for depositing such bulk passivation material 224 are known to one of ordinary skill in the art of integrated circuit fabrication.

In this manner, the additional encapsulating material 222 which covers the top surface of the conductive fill 218 prevents copper of the conductive fill 218 from laterally drifting along the bottom surface 226 of the layer of bulk passivation material 224 and into the surrounding insulating layer 204. The additional encapsulating material 222 caps the conductive fill 218 such that the copper of the conductive fill 218 is contained within the trench 202. Minimization of drift of copper from the conductive fill 218 into the surrounding insulating layer 204 preserves the integrity of the surrounding insulating layer 204.

In addition, because the metal dopant has a concentration in the seed layer 214 that is lower than the solid solubility of the metal dopant in the bulk conductive material of the seed layer 214, the metal dopant of the seed layer 214 remains within the seed layer 214 during the thermal anneal for recrystallizing the conductive fill 218. The alloy of the seed layer 214 is used primarily to prevent formation of granules of agglomerated copper during conformal deposition of the seed layer 214 on the sidewalls and the bottom wall of the interconnect opening 202. In addition, the metal dopant, such as silver or zinc, of the copper seed layer 214 minimally increases the resistance of the copper seed layer 214.

For example, when the metal dopant of the copper seed layer 214 is silver, the increase in resistance for such a copper alloy is about 0.2 microOhms-centimeters per 1 atomic percent silver doping concentration. When the metal dopant of the copper seed layer 214 is zinc, the increase in resistance for such a copper alloy is about 0.3 microOhms-centimeters per 1 atomic percent zinc doping concentration. Such increase in resistance is smaller than other types of metal dopants of copper alloys.

Figure 14:
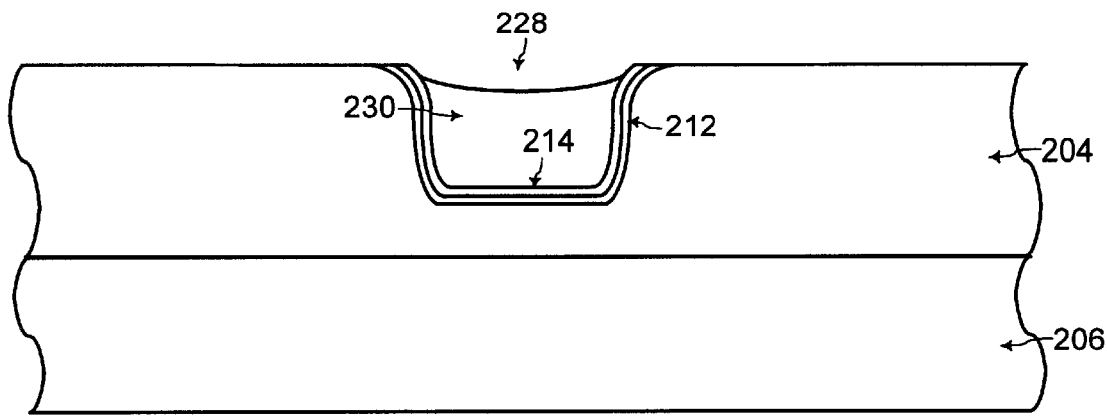
Figure 15:
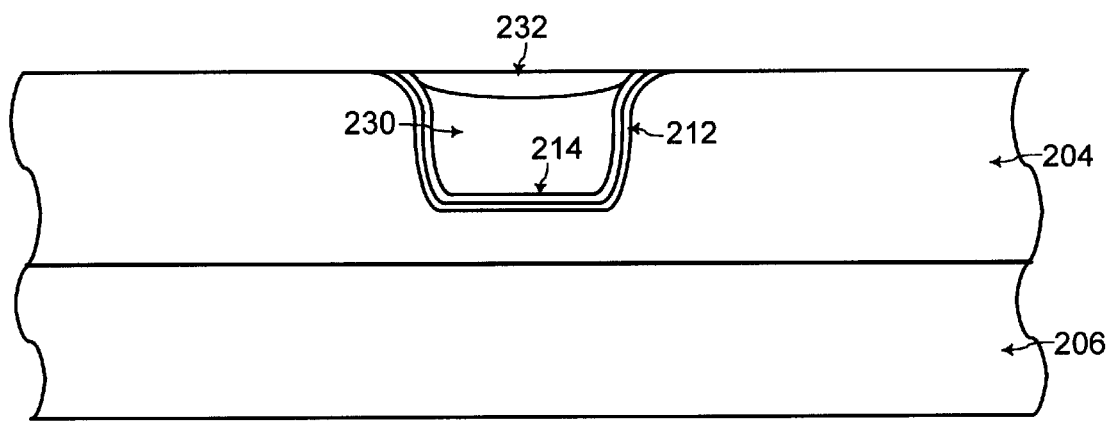

Referring to FIGS. 14 and 15, in an alternative embodiment of the present invention, a portion of the conductive material filling the interconnect opening may be comprised of an alloy. In that case, referring to FIG. 9, the bulk conductive material 216 deposited to fill the interconnect opening 202 is comprised of substantially pure copper. Referring to FIGS. 9 and 14, the bulk conductive material 216 of substantially pure copper is polished down to form a recess 228 during the CMP (chemical mechanical polishing) process. In that case, a substantially pure copper fill 230 is contained at the bottom portion of the interconnect opening 202.

The recess 228 is formed on the top surface of the substantially pure copper fill 230 according to the "dishing effect" during a CMP process, as known to one of ordinary skill in the art of integrated circuit fabrication. Parameters of the CMP process such as the roughness of the polishing pad may be controlled to affect the formation of the recess 228 on the top surface of the substantially pure copper fill 230, as known to one of ordinary skill in the art of integrated circuit fabrication. Typically, the "dishing effect" and the formation of a recess on an interconnect are avoided in the prior art, but in an aspect of the present invention, parameters of the CMP are intentionally controlled for formation of the recess 228 on the top surface of the substantially pure copper fill 230.

Referring to FIGS. 14 and 15, a second copper alloy 232 with the second metal dopant is deposited to fill the recess 228 at the top portion of the interconnect opening. As described for the copper alloy of the conductive fill 218 of FIGS. 10, 11, 12, and 13, the second metal dopant has a relatively low solid solubility (less than about 0.1 atomic percent at about room temperature) within the copper of the second copper alloy 232. Examples of such a second metal dopant include tantalum, calcium, cerium, and zirconium. In addition, the second metal dopant has a concentration in the copper of the second copper alloy 232 that is greater than the solid solubility of the second metal dopant in copper. For example, when the second metal dopant is comprised of one tantalum, calcium, cerium, or zirconium, the concentration of the second metal dopant in the bulk conductive material 216 comprised of copper may be in a range of from about 0.1 atomic percent to about 1 atomic percent because the solid solubility of such metal dopants in copper is negligible.

With such a copper alloy 232 at the top portion of the interconnect opening, during the thermal anneal for recrystallizing the substantially pure copper fill 230 and the second copper alloy 232, the substantially pure copper fill 230 and the second copper alloy 232 recrystallize to form a conductive fill of a substantially single grain structure within the interconnect opening 202. In addition, during the thermal anneal, the metal dopant of the copper alloy 232 segregates out of the copper alloy 232 to the top surface 220 of the conductive fill to form the additional encapsulating material 222 that covers the top surface of the conductive fill, similarly as described in relation to FIGS. 11 and 12 to prevent drift of conductive material from the conductive fill of the interconnect opening 202 into the surrounding insulating layer 204.

Figure 16:
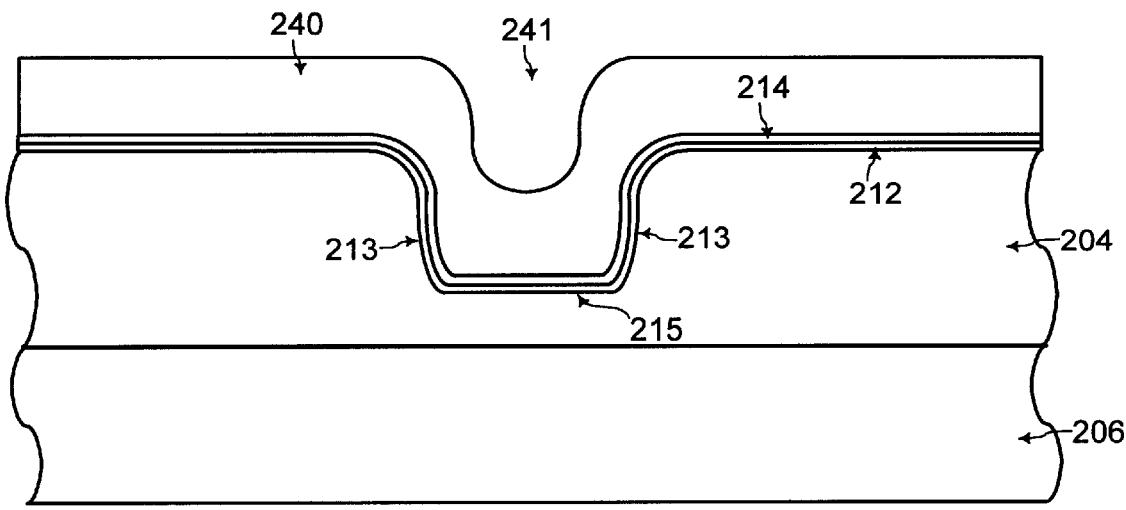

In another embodiment of the present invention, referring to FIG. 16, a layer of substantially pure copper 240 is deposited in the interconnect opening 202. The layer of substantially pure copper 240 is typically electroplated from the seed layer 214, as known to one of ordinary skill in the art of integrated circuit fabrication. The layer of substantially pure copper 240 is deposited to only partially fill the interconnect opening 202 (i.e., about 70% to 90% of the volume of the interconnect opening 202) to leave a recess 241 within the layer of substantially pure copper 240. The recess 241 is disposed toward the top of the interconnect opening 202.

Figure 17:
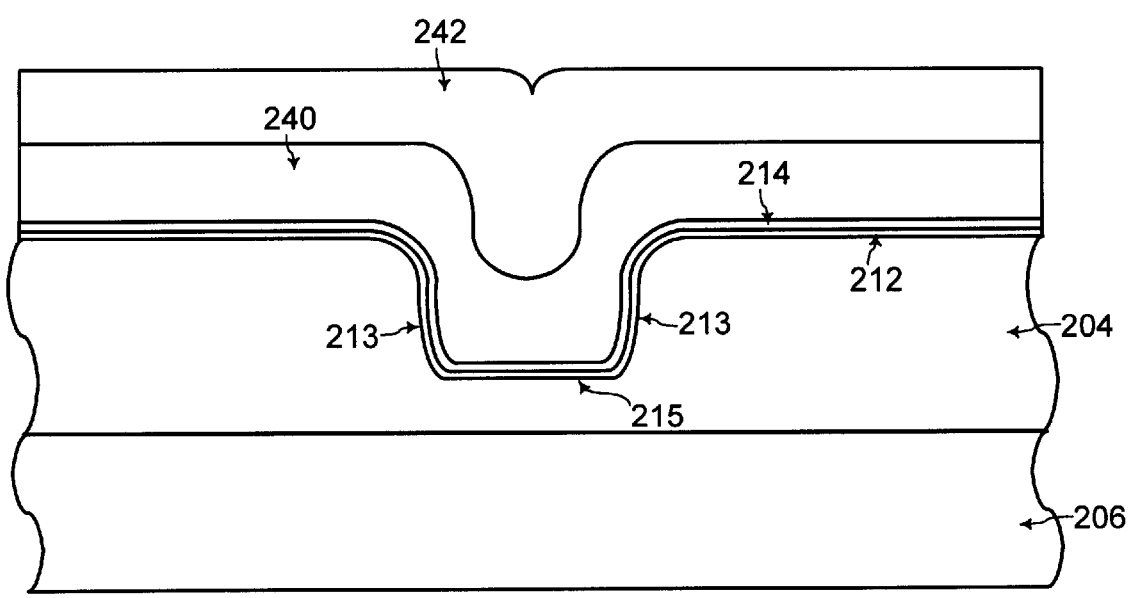

Referring to FIG. 17, the recess 241 is filled with a second copper alloy 242 with a second metal dopant. As described for the copper alloy of the conductive fill 218 of FIGS. 10, 11, 12, and 13, the second metal dopant has a relatively low solid solubility (less than about 0.1 atomic percent at about room temperature) within the copper of the second copper alloy 242. Examples of such a second metal dopant include tantalum, calcium, cerium, and zirconium. In addition, the second metal dopant has a concentration in the copper of the second copper alloy 242 that is greater than the solid solubility of the second metal dopant in copper. For example, when the second metal dopant is comprised of one tantalum, calcium, cerium, or zirconium, the concentration of the second metal dopant in the bulk conductive material comprised of copper may be in a range of from about 0.1 atomic percent to about 1 atomic percent because the solid solubility of such metal dopants in copper is negligible. Processes such as PVD (plasma vapor deposition) and CVD (chemical vapor deposition) for depositing such a second copper alloy 242 in the recess 241 are known to one of ordinary skill in the art of integrated circuit fabrication.

Figure 18:
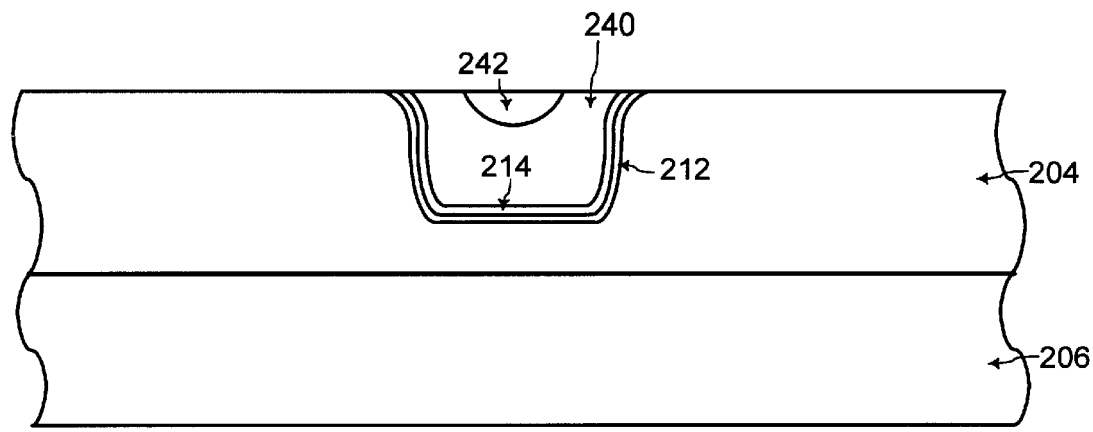

Referring to FIG. 18, the layer of substantially pure copper 240 and the second copper alloy 242 are polished away from the insulating layer 204 until the insulating layer 204 is exposed such that the substantially pure copper 240 and the second copper alloy 242 are contained within the interconnect opening 202. In this manner, the second copper alloy 242 is formed at the top of the interconnect opening 202. Processes such as CMP (chemical mechanical polishing) processes for polishing away the layer of substantially pure copper 240 and the second copper alloy 242 are known to one of ordinary skill in the art of integrated circuit fabrication.

Figure 19:
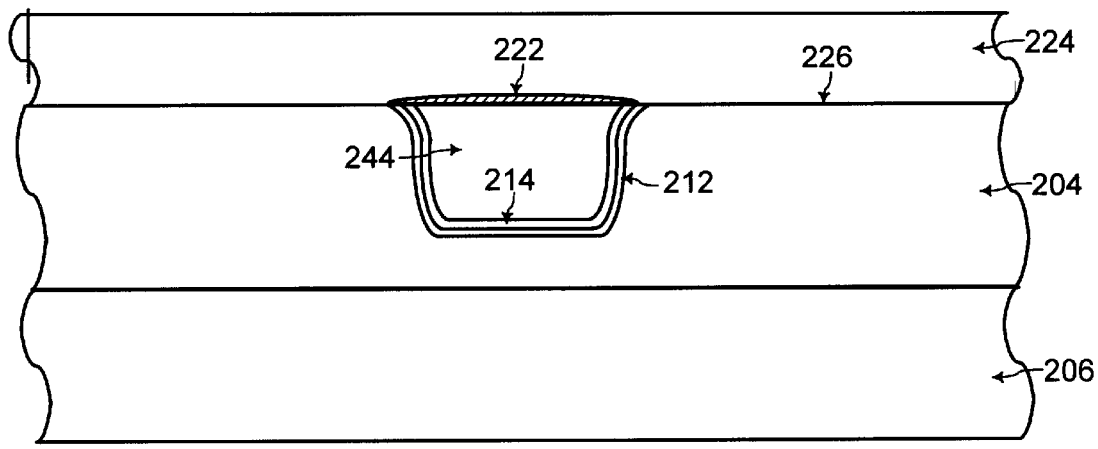

Referring to FIGS. 18 and 19, with the second copper alloy 242 at the top portion of the interconnect opening, during the thermal anneal for recrystallizing the substantially pure copper 240 and the second copper alloy 242, the substantially pure copper 240 and the second copper alloy 242 recrystallize to form a conductive fill of a substantially single grain structure 244 within the interconnect opening. In addition, during the thermal anneal, the metal dopant of the copper alloy 242 segregates out of the copper alloy 242 to the top surface of the conductive fill 244 to form the additional encapsulating material 222 that covers the top surface of the conductive fill, similarly as described in relation to FIGS. 11 and 12. The additional encapsulating material 222 prevents drift of conductive material from the conductive fill 244 of the interconnect opening along the bottom surface 226 of the layer of bulk passivation material 224 and into the surrounding insulating layer 204.

The foregoing is by way of example only and is not intended to be limiting. For example, the present invention is described for formation of copper interconnect. However, the present invention may be practiced for preventing drift of material from other types of interconnects into the surrounding insulating layer, as would be apparent to one of ordinary skill in the art of integrated circuit fabrication from the description herein. Any material specified herein is by way of example only.

Furthermore, as will be understood by those skilled in the art, the structures described herein may be made or used in the same way regardless of their position and orientation. Accordingly, it is to be understood that terms and phrases such as "top," "bottom," and "sidewalls" as used herein refer to relative location and orientation of various portions of the structures with respect to one another, and are not intended to suggest that any particular absolute orientation with respect to external objects is necessary or required. The present invention is limited only as defined in the following claims and equivalents thereof.

We claim:

1. A method for filling an interconnect opening of an integrated circuit, said interconnect opening being within an insulating layer on a semiconductor wafer, the method including the steps of:

A. depositing a seed layer of a first alloy conformally onto sidewalls and a bottom wall of said interconnect opening, wherein said first alloy is comprised of a first metal dopant in a bulk conductive material, and wherein said first metal dopant has a solid solubility in said bulk conductive material that is higher than about 0.09 atomic percent at about room temperature, and wherein said first metal dopant has a concentration in said bulk conductive material of said seed layer that is lower than said solid solubility of said first metal dopant in said bulk conductive material;

B. filling said interconnect opening with said bulk conductive material by growing said bulk conductive material from said seed layer to form a conductive fill within said interconnect opening, wherein at least a portion of said conductive fill is comprised of a second alloy with a second metal dopant having a solid solubility in said bulk conductive material that is less than about 0.1 atomic percent at about room temperature, and wherein said second metal dopant has a concentration in said portion of said conductive fill that is higher than said solid solubility of said second metal dopant in said bulk conductive material;

C. polishing away any of said seed layer of said first alloy and said bulk conductive material from said insulating layer surrounding said interconnect opening such that said conductive fill is contained within said interconnect opening and such that said insulating layer surrounding said interconnect opening is exposed;

D. performing a thermal anneal after said step C to form an additional encapsulating material that covers a top surface of said conductive fill contained within said interconnect opening with said insulating layer surrounding said interconnect opening being exposed, wherein said additional encapsulating material is formed from said second metal dopant diffusing out of said conductive fill during said thermal anneal; and E. forming a layer of bulk passivation material over said additional encapsulating material and said insulating layer.

2. The method of claim 1, wherein said bulk conductive material is copper, and wherein said first metal dopant is one of silver and zinc.

3. The method of claim 1, wherein said additional encapsulating material is comprised of said second metal dopant that diffuses out of said conductive fill to cover said top surface of said conductive fill during said thermal anneal.

4. The method of claim 3, wherein said bulk conductive material is copper, and wherein said second metal dopant is one of tantalum, calcium, and cerium.

5. The method of claim 3, wherein said additional encapsulating material also forms along an interface between said conductive fill and said seed layer during said thermal anneal.

6. The method of claim 1, wherein said additional encapsulating material is an intermetallic compound formed from a reaction of said second metal dopant with said bulk conductive material at said top surface of said conductive fill during said thermal anneal.

7. The method of claim 6, wherein said bulk conductive material is copper, and wherein said second metal dopant is zirconium.

8. The method of claim 1, further including a step of:

depositing a diffusion barrier material on sidewalls and a bottom wall of said interconnect opening before said step A.

9. The method of claim 1, wherein said bulk encapsulating layer is comprised of one of silicon oxynitride (SiON), silicon nitride (SiN), and a silicon carbide (SiC) film doped with hydrogen.

10. The method of claim 1, wherein said step D of performing said thermal anneal includes heating said semiconductor wafer to a temperature in a range of from about 250° Celsius to about 400° Celsius for a time period in a range of from about 1 minute to about 60 minutes.

11. A method for filling an interconnect opening of an integrated circuit, said interconnect opening being within an insulating layer on a semiconductor wafer, the method including the steps of:

A. depositing a seed layer of a first alloy conformally onto sidewalls and a bottom wall of said interconnect opening, wherein said first alloy is comprised of a first metal dopant in a bulk conductive material, and wherein said first metal dopant has a solid solubility in said bulk conductive material that is higher than about 0.09 atomic percent at about room temperature, and wherein said first metal dopant has a concentration in said bulk conductive material of said seed layer that is lower than said solid solubility of said first metal dopant in said bulk conductive material;

B. filling said interconnect opening with said bulk conductive material by growing said bulk conductive material from said seed layer to form a conductive fill within said interconnect opening, wherein at least a portion of said conductive fill is comprised of a second alloy with a second metal dopant having a solid solubility in said bulk conductive material that is less than about 0.1 atomic percent at about room temperature, and wherein said second metal dopant has a concentration in said portion of said conductive fill that is higher than said solid solubility of said second metal dopant in said bulk conductive material;

C. polishing away any of said seed layer of said first alloy and said bulk conductive material from said insulating layer surrounding said interconnect opening such that said conductive fill is contained within said interconnect opening;

D. performing a thermal anneal to form an additional encapsulating material that covers a top surface of said conductive fill, wherein said additional encapsulating material is formed from said second metal dopant diffusing out of said conductive fill during said thermal anneal;

E. forming a layer of bulk passivation material over said additional encapsulating material and said insulating layer; and F. exposing said top surface of said conductive fill to an oxygen plasma during said thermal anneal in said step D such that said additional encapsulating material is comprised of a metal oxide formed from a reaction of said oxygen plasma and said second metal dopant during said thermal anneal.

12. The method of claim 11, wherein said bulk conductive material is copper, and wherein said second metal dopant is zirconium.

13. The method of claim 11, wherein said bulk conductive material is copper, and wherein said first metal dopant is one of silver and zinc.

14. The method of claim 11, further including a step of:
depositing a diffusion barrier material on sidewalls and a bottom wall of said interconnect opening before said step A.

15. The method of claim 11, wherein said bulk encapsulating layer is comprised of one of silicon oxynitride (SiON), silicon nitride (SiN), and a silicon carbide (SiC) film doped with hydrogen.

16. The method of claim 11, wherein said step D of performing said thermal anneal includes heating said semiconductor wafer to a temperature in a range of from about 250° Celsius to about 400° Celsius for a time period in a range of from about 1 minute to about 60 minutes.

* * * * *